United States Patent
Fujita et al.

(10) Patent No.: US 9,439,310 B2
(45) Date of Patent: Sep. 6, 2016

(54) HINGE STRUCTURE AND ELECTRONIC DEVICE

(71) Applicant: NINTENDO CO., LTD., Kyoto (JP)

(72) Inventors: Kumpei Fujita, Kyoto (JP); Takashi Murakami, Kyoto (JP)

(73) Assignee: NINTENDO CO., LTD., Kyoto (JP)

( * ) Notice: Subject to any disclaimer, the term of this patent is extended or adjusted under 35 U.S.C. 154(b) by 0 days.

(21) Appl. No.: 13/930,114

(22) Filed: Jun. 28, 2013

(65) Prior Publication Data

US 2014/0016250 A1    Jan. 16, 2014

(30) Foreign Application Priority Data

Jul. 12, 2012  (JP) ................................. 2012-156547

(51) Int. Cl.
*E05D 11/10* (2006.01)
*H05K 5/02* (2006.01)
*G06F 1/16* (2006.01)

(52) U.S. Cl.
CPC ........... *H05K 5/0226* (2013.01); *G06F 1/1681* (2013.01); *Y10T 16/54038* (2015.01); *Y10T 16/557* (2015.01)

(58) Field of Classification Search
CPC .................... E05Y 2900/606; Y10T 16/5387; Y10T 16/540225; E05D 11/1078; H04M 1/0216
USPC ......... 16/319, 321, 325, 328–330, 334, 340, 16/303
See application file for complete search history.

(56) References Cited

U.S. PATENT DOCUMENTS

| 5,894,635 | A | 4/1999 | Lu | |
|---|---|---|---|---|
| 6,076,232 | A | 6/2000 | Saida et al. | |
| 7,596,830 | B2 * | 10/2009 | Yin | G06F 1/1616 16/303 |
| 8,336,167 | B2 * | 12/2012 | Kim | 16/303 |
| 8,432,677 | B2 * | 4/2013 | Duan et al. | 361/679.27 |
| 2001/0053674 | A1 * | 12/2001 | Katoh | 455/90 |
| 2006/0123596 | A1 * | 6/2006 | Chen et al. | 16/337 |

(Continued)

FOREIGN PATENT DOCUMENTS

JP 2002-195243 7/2002
JP 2003-194044 A 7/2003

(Continued)

OTHER PUBLICATIONS

Mar. 14, 2016 Extended European Search Report issued in European Application No. 13173843.7.

*Primary Examiner* — Victor Batson
*Assistant Examiner* — Matthew Sullivan
(74) *Attorney, Agent, or Firm* — Nixon & Vanderhye P.C.

(57) ABSTRACT

An exemplary embodiment provides a hinge structure capable of achieving improved durability. The hinge structure includes a hinge pin having a first member and a second member having one end surface and the other end surface provided at a distance from each other in an axial direction, having a protrusion portion provided to protrude from one end surface in the axial direction, arranged to be opposed to the first member at the other end surface, and being pivotable with respect to the first member, and a hinge pin reception portion having a recess portion fitting to a part of the second member and the protrusion portion of the hinge pin. The protrusion portion has a first surface portion extending in a radial direction of the second member. The recess portion has a second surface portion which can be engaged with the first surface portion.

6 Claims, 14 Drawing Sheets

(56) References Cited

U.S. PATENT DOCUMENTS

| | | | |
|---|---|---|---|
| 2006/0143861 A1* | 7/2006 | Luo | 16/303 |
| 2006/0147035 A1* | 7/2006 | Duan et al. | 379/433.13 |
| 2006/0256958 A1* | 11/2006 | Duan et al. | 379/433.01 |
| 2007/0039135 A1* | 2/2007 | Duan et al. | 16/330 |
| 2007/0294859 A1* | 12/2007 | Hsu et al. | 16/330 |
| 2008/0066262 A1* | 3/2008 | Liu et al. | 16/319 |
| 2009/0064461 A1* | 3/2009 | Yin et al. | 16/330 |
| 2009/0133217 A1* | 5/2009 | Lin | 16/277 |
| 2009/0151121 A1* | 6/2009 | Lin | 16/321 |
| 2009/0217486 A1* | 9/2009 | Itakura et al. | 16/334 |
| 2009/0260183 A1* | 10/2009 | Chen et al. | 16/223 |
| 2009/0280874 A1* | 11/2009 | Kosugi et al. | 455/575.3 |
| 2009/0293229 A1* | 12/2009 | Chiang | 16/342 |
| 2010/0000047 A1* | 1/2010 | Chang | G06F 1/1616 16/334 |
| 2010/0319162 A1* | 12/2010 | Kubota et al. | |
| 2013/0081228 A1* | 4/2013 | Janak | 16/250 |

FOREIGN PATENT DOCUMENTS

| | | |
|---|---|---|
| JP | 2009-36279 | 2/2009 |
| JP | 2010-510444 A | 4/2010 |
| WO | WO 2008/058771 A1 | 5/2008 |

* cited by examiner

HINGE STRUCTURE AND ELECTRONIC DEVICE

This nonprovisional application is based on Japanese Patent Application No. 2012-156547 filed on Jul. 12, 2012 with the Japan Patent Office, the entire contents of which are hereby incorporated by reference.

FIELD

The technology herein relates to a hinge structure and an electronic device, and particularly to a hinge structure including a hinge pin and a hinge pin reception portion and an electronic device including the same.

BACKGROUND AND SUMMARY

A hinge structure for pivotably connecting a plurality of housings has conventionally been employed in a foldable electronic device or the like.

Exemplary embodiments provide a hinge structure capable of achieving improved durability and an electronic device including the same.

An exemplary embodiment provides a hinge structure including a hinge pin having a first member and a second member having one end surface and the other end surface provided at a distance from each other in an axial direction, having a protrusion portion provided to protrude from one end surface in the axial direction, arranged to be opposed to the first member at the other end surface, and being pivotable with respect to the first member, and a hinge pin reception portion having a recess portion fitting to a part of the second member and the protrusion portion of the hinge pin. The protrusion portion has a first surface portion extending in a radial direction of the second member. The recess portion has a second surface portion which can be engaged with the first surface portion.

According to the exemplary embodiment, a part of the second member and the protrusion portion fit to the recess portion. Therefore, in pivoting the second member with respect to the first member, load applied to the hinge pin reception portion can be distributed to parts of the recess portion fitted to the part of the second member and the protrusion portion. By thus distributing load applied to the hinge pin reception portion, durability of the hinge structure can be improved.

In addition, the second surface portion engaged with the first surface portion protruding from one end surface in the axial direction and extending in the radial direction of the second member can receive load during pivot of the second member with respect to the first member. Namely, since a surface of the second surface portion can receive load in a direction of pivot, load applied to the second surface portion can be distributed. By thus distributing load applied to the hinge pin reception portion, durability of the hinge structure can be improved.

An exemplary embodiment is constructed to suppress pivot of the second member with respect to the hinge pin reception portion owing to engagement of the first and second surface portions with each other. As the first surface portion and the second surface portion are engaged with each other, pivot of the second member with respect to the hinge pin reception portion is suppressed and hence the second surface portion can receive load. Therefore, since the surface of the second surface portion can receive load in a direction of pivot, load applied to the second surface portion can be distributed.

In an exemplary embodiment, the first surface portion includes a right rotation abutment surface abutting to the second surface portion when the hinge pin rotates to the right around the axial direction and a left rotation abutment surface abutting to the second surface portion when the hinge pin rotates to the left around the axial direction. The right rotation abutment surface can distribute load applied to the hinge pin reception portion during rotation to the right and the left rotation abutment surface can distribute load applied to the hinge pin reception portion during rotation to the left. Therefore, in any of rotation to the right and rotation to the left, load applied to the hinge pin reception portion can be distributed.

In an exemplary embodiment, the protrusion portion is constructed such that a portion defining the right rotation abutment surface and a portion defining the left rotation abutment surface are linked to each other. Therefore, the protrusion portion can integrally be formed such that the portion defining the right rotation abutment surface and the portion defining the left rotation abutment surface are linked to each other. Thus, strength of the protrusion portion can be improved.

In an exemplary embodiment, the protrusion portion has a shape asymmetric with respect to a center of one end surface. Therefore, even when load is different depending on a direction of pivot, the protrusion portion can be formed in accordance with load.

In an exemplary embodiment, the recess portion is provided to expose a part of the protrusion portion. Therefore, engagement between the protrusion portion and the recess portion can visually be checked. Therefore, the protrusion portion and the recess portion can reliably be fitted to each other.

An exemplary embodiment provides an electronic device including the hinge structure above, a first housing to which a hinge pin is attached, and a second housing to which a hinge pin reception portion is attached. Thus, an electronic device including a hinge structure capable of achieving improved durability can be provided.

The foregoing and other objects, features, aspects and advantages of the exemplary embodiments will become more apparent from the following detailed description of the exemplary embodiments when taken in conjunction with the accompanying drawings.

DETAILED DESCRIPTION OF NON-LIMITING EXAMPLE EMBODIMENTS

Exemplary embodiments will be described hereinafter with reference to the drawings.

Initially, a construction of a game device in an exemplary embodiment will be described. In exemplary embodiments, a case where a hinge structure is applied to a game device will be described by way of example.

Figure 1:
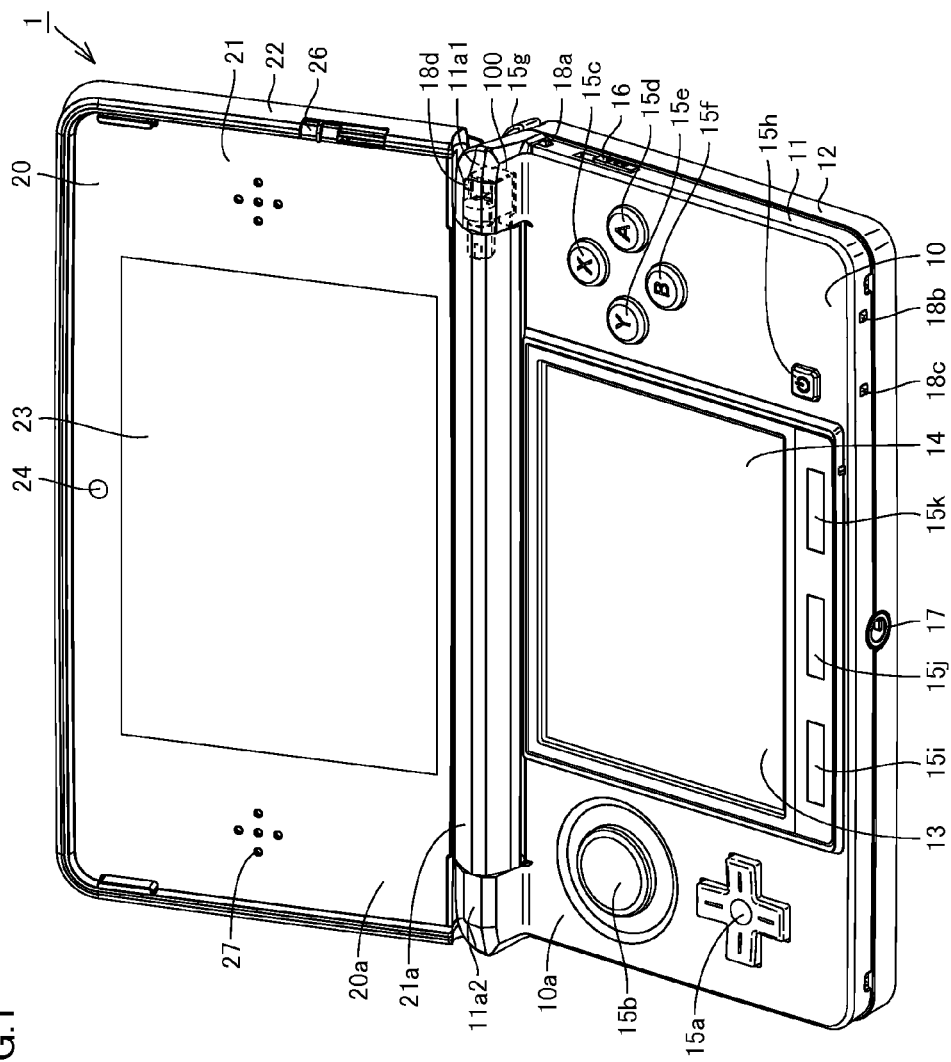
FIG. 1 shows an exemplary illustrative non-limiting schematic perspective view showing an open state of a game device according to an exemplary embodiment.
Figure 2:
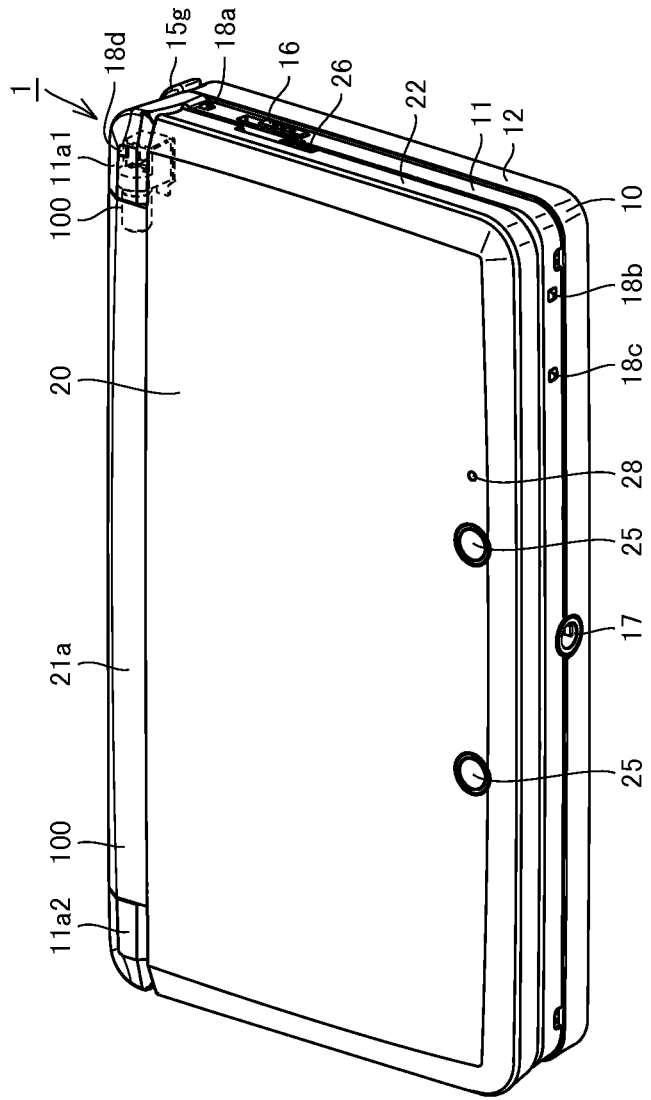
FIG. 2 shows an exemplary illustrative non-limiting schematic perspective view showing a closed state of the game device according to an exemplary embodiment.
Figure 3:
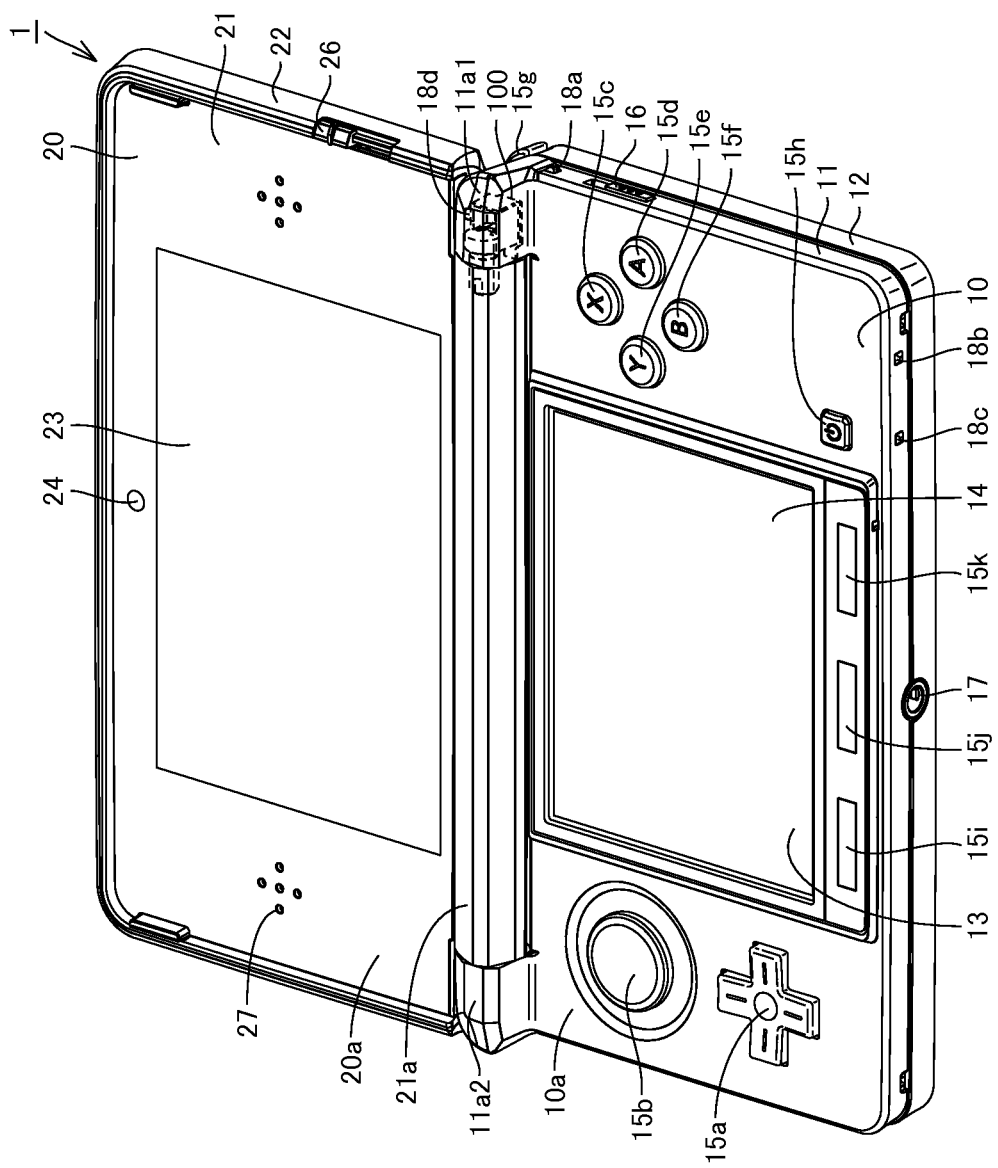
FIG. 3 shows an exemplary illustrative non-limiting schematic perspective view showing a full open state of the game device according to an exemplary embodiment.

Referring to FIGS. 1 to 3, a game device 1 is a portable game device. Game device 1 is constructed to be foldable. Game device 1 mainly has a lower housing 10, an upper housing 20, and a hinge structure 100. Lower housing 10 and upper housing 20 are connected to each other by means of hinge structure 100 to allow opening and closing (be foldable).

Game device 1 is constructed to be able to be in an opened state (an open state) shown in FIG. 1, a closed state (a closed state) shown in FIG. 2, and a fully opened state (a full open state) shown in FIG. 3 as lower housing 10 and upper housing 20 are opened and closed by means of hinge structure 100. A main surface 10a of lower housing 10 and a main surface 20a of upper housing 20 are arranged with respect to each other, for example, at an angle of 155 degrees in the open state, arranged, for example, at an angle of 0 degree in the closed state, and arranged, for example, at an angle of 180 degrees in the full open state. Main surface 10a of lower housing 10 and main surface 20a of upper housing 20 are located on an outer side in the open state and the full open state and not located on the outer side in the closed state.

Lower housing 10 mainly has a lower front part 11, a lower rear part 12, a lower LCD (Liquid Crystal Display) 13, a touch panel 14, a cross key 15a, an analog key 15b, operation buttons 15c to 15g, a power button 15h, a select button 15i, a home button 15j, a start button 15k, a wireless switch 16, an earphone jack 17, and LEDs 18a to 18d (Light Emitting Diodes).

Lower front part 11 forms main surface 10a and a front side surface of lower housing 10. Lower rear part 12 forms a back surface and a rear side surface of lower housing 10. On main surface 10a of lower housing 10, lower LCD 13, touch panel 14, cross key 15a, analog key 15b, operation buttons 15c to 15f, power button 15h, select button 15i, home button 15j, and start button 15k are arranged. Wireless switch 16 and LED 18a are arranged on a right side surface of lower housing 10, earphone jack 17 and LEDs 18b, 18c are arranged on a front surface thereof, and operation button 15g is arranged on the rear surface thereof. It is noted that LED 18d is arranged in a lower protrusion portion 11a1 of lower housing 10 which will be described later.

In addition, lower housing 10 has a game card unit, an SD card unit, a touch pen holder, a power supply connector, a cradle connection terminal, a sound volume switch, and the like, which are not shown. The game card unit, the SD card unit, the touch pen holder, the power supply connector, and the cradle connection terminal are arranged in the back surface of lower housing 10, and the sound volume switch is arranged on a left side surface thereof. In addition, lower housing 10 contains a wireless communication module, a microphone, a battery, an information processing unit, and the like therein, which are not shown.

Upper housing 20 mainly has an upper front part 21, an upper rear part 22, an upper LCD 23, an inner image pick-up portion 24, an outer image pick-up portion 25, a parallax amount adjustment switch 26, a sound emission hole 27, and an LED 28. Upper front part 21 forms main surface 20a of upper housing 20. Upper rear part 22 forms a back surface and a side surface of upper housing 20.

Upper LCD 23, inner image pick-up portion 24, and sound emission hole 27 are arranged on main surface 20a of upper housing 20. Two outer image pick-up portions 25 and LED 28 are arranged on the back surface of upper housing 20. Parallax amount adjustment switch 26 is arranged at a corner portion of main surface 20a and a right side surface of upper housing 20. In addition, upper housing 20 contains a not-shown speaker and the like therein.

Lower housing 10 has lower protrusion portions 11a1 and 11a2 at respective opposing end portions of an upper longer side portion, which protrude in a direction perpendicular to main surface 10a of lower housing 10. Lower protrusion portions 11a1 and 11a2 are provided in lower front part 11 so as to protrude in a direction opposite to lower rear part 12. Upper housing 20 has an upper protrusion portion 21a in a portion except for the opposing end portions of the lower longer side portion, which protrudes from a lower surface of upper housing 20 in a direction perpendicular to the lower surface. Upper protrusion portion 21a is provided to extend along main surface 20a of upper housing 20.

As lower protrusion portions 11a1 and 11a2 of lower housing 10 and upper protrusion portion 21a of upper housing 20 are coupled to each other by means of hinge structure 100, lower housing 10 and upper housing 20 are connected to each other to be foldable. Hinge structure 100 shown in FIG. 4 is accommodated in the inside of lower protrusion portion 11a1 and upper protrusion portion 21a shown in FIG. 1.

Figure 4:
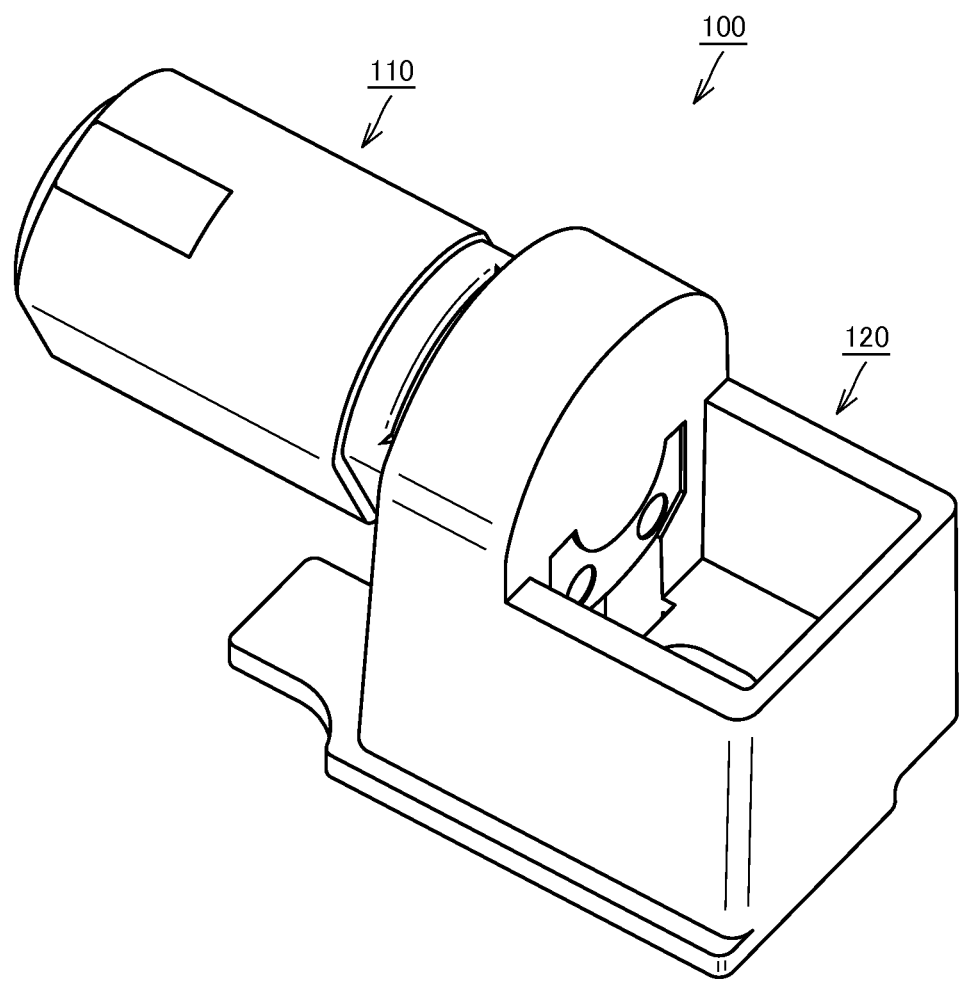
FIG. 4 shows an exemplary illustrative non-limiting enlarged perspective view of a hinge structure in FIG. 1 according to an exemplary embodiment.

Referring to FIGS. 1 and 4, hinge structure 100 couples lower housing 10 and upper housing 20 to each other to allow opening and closing. Hinge structure 100 has a hinge pin 110 and a hinge pin reception portion 120. Hinge pin 110 is attached to upper protrusion portion 21a of upper front part 21 of upper housing (a first housing) 20. Hinge pin reception portion 120 is attached to lower protrusion portion 11a1 of lower front part 11 of lower housing (a second housing) 10.

Figure 5:
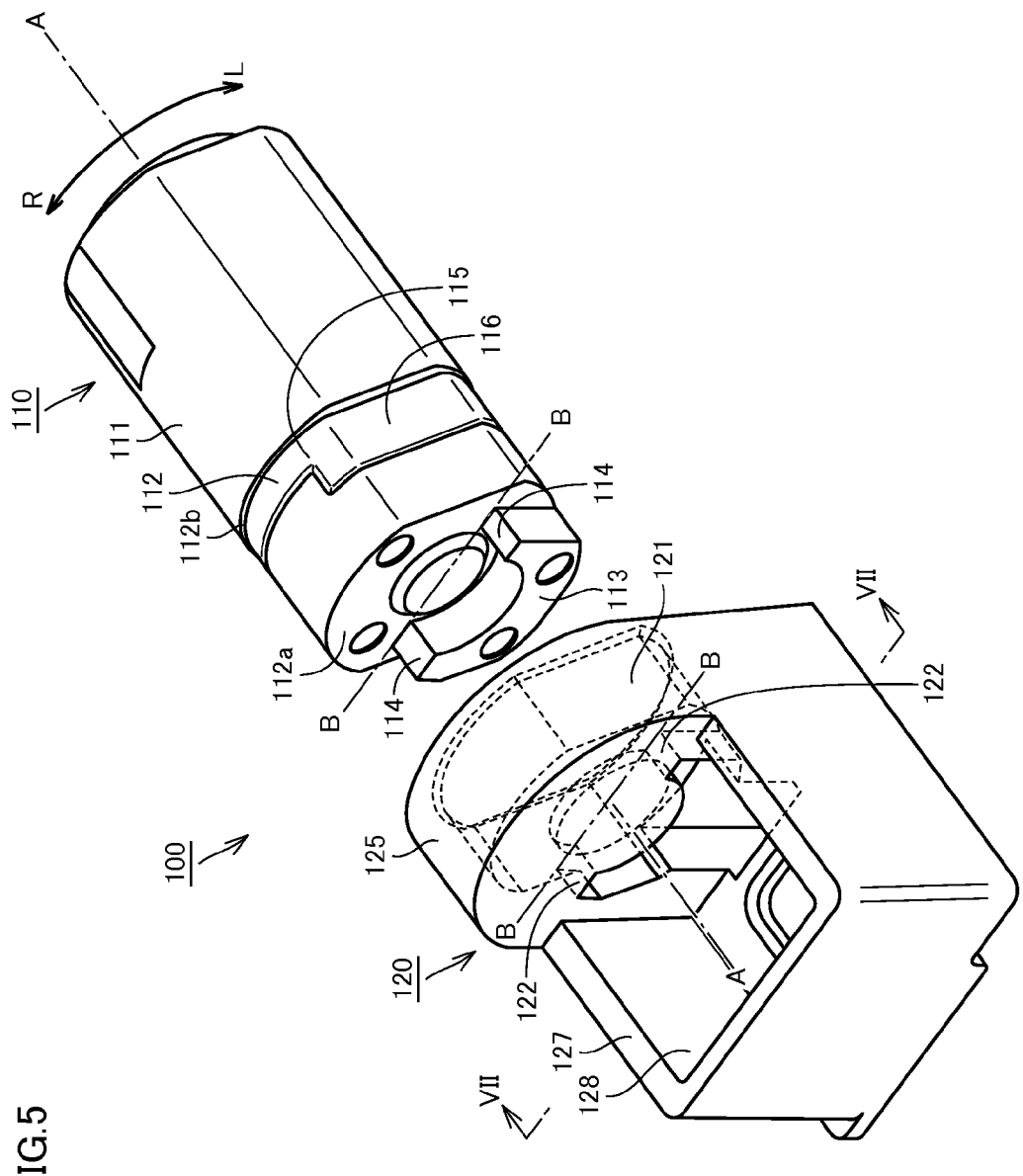
FIG. 5 shows an exemplary illustrative non-limiting schematic exploded perspective view when viewed from a side of a hinge pin reception portion of the hinge structure according to an exemplary embodiment.
Figure 6:
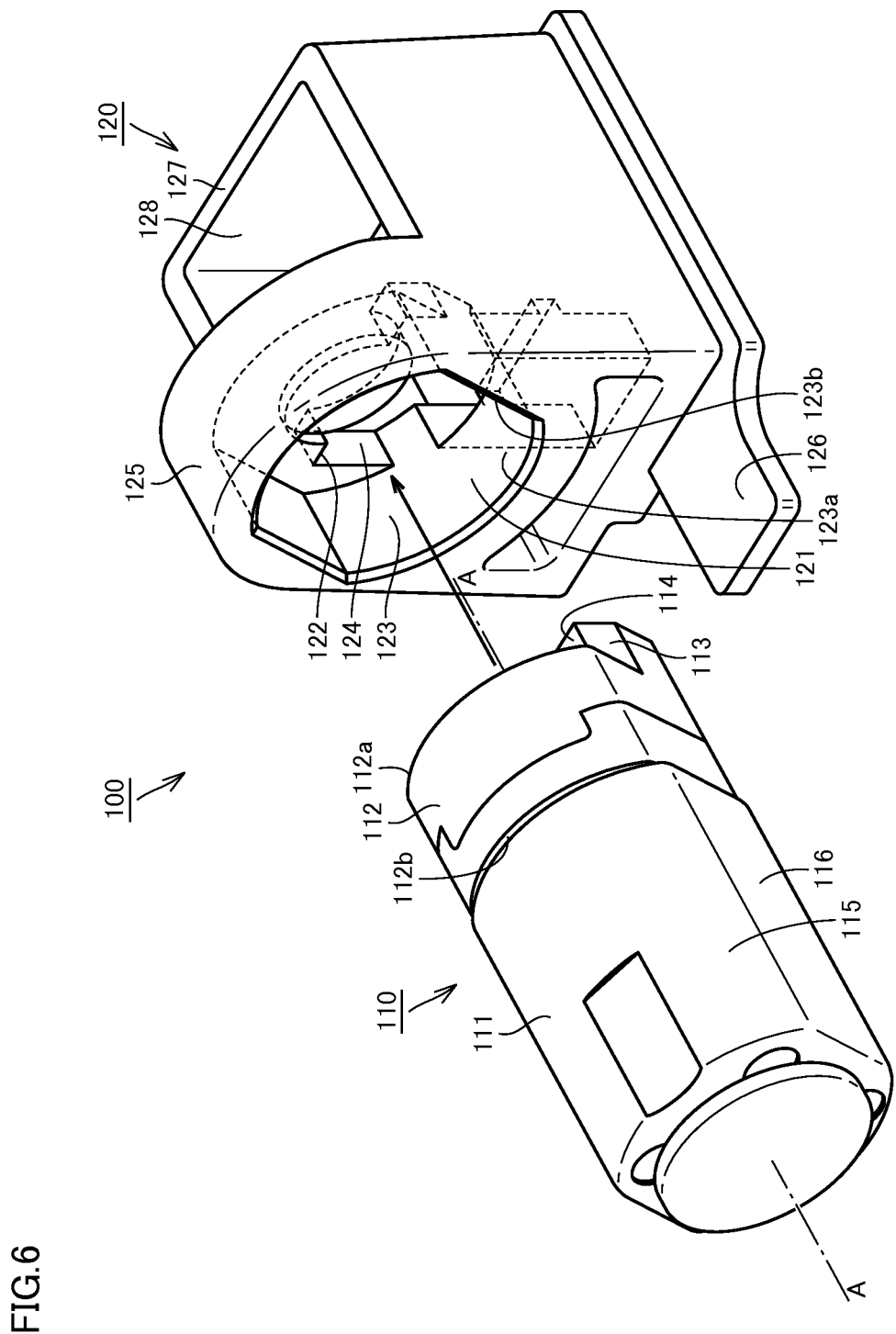
FIG. 6 shows an exemplary illustrative non-limiting schematic exploded perspective view when viewed from a side of a hinge pin of the hinge structure according to an exemplary embodiment.

Referring to FIGS. 5 and 6, hinge pin 110 has a first member 111 and a second member 112. Hinge pin 110 has a substantially columnar shape. Second member 112 has one end surface 112a and the other end surface 112b provided at a distance from each other in an axial direction A. Second member 112 has a protrusion portion 113 provided to protrude from one end surface 112a in axial direction A. Second member 112 is arranged to be opposed to first member 111 at the other end surface 112b. Second member 112 is constructed to be pivotable with respect to first member 111. An outer circumferential surface of hinge pin 110 has two arc portions 115 and two planar portions 116 linking two arc portions 115.

Two arc portions 115 and two planar portions 116 are formed in both of first member 111 and second member 112. Planar portion 116 of second member 112 is constructed such that it fits to a linear inner circumferential portion 123b which will be described later to thereby suppress pivot during pivot of second member 112.

Hinge pin reception portion 120 has a recess portion 121 fitted to a part of second member 112 and protrusion portion 113 of hinge pin 110. Protrusion portion 113 has a first surface portion 114 extending in a radial direction B of second member 112. Radial direction B is a direction other than a direction of an outer circumference of second member 112. Recess portion 121 has a second surface portion 122 which can be engaged with first surface portion 114.

Hinge structure 100 is constructed such that first surface portion 114 and second surface portion 122 are engaged with each other to thereby suppress pivot of second member 112 with respect to hinge pin reception portion 120.

Recess portion 121 of hinge pin reception portion 120 has a first recess portion 123 and a second recess portion 124 communicating with first recess portion 123. First recess portion 123 has an arc-shaped inner circumferential portion 123a and linear inner circumferential portion 123b. Hinge pin reception portion 120 has a projection portion 125 where a part of recess portion 121 is provided, a stopper portion 126 arranged opposite to projection portion 125 with respect to recess portion 121, an outer wall portion 127, and a space 128 surrounded by outer wall portion 127. While hinge pin 110 is inserted in hinge pin reception portion 120, protrusion portion 113 of hinge pin 110 is exposed to space 128.

While hinge pin 110 is inserted in recess portion 121, recess portion 121 is fitted to hinge pin 110. Specifically, the part of second member 112 and protrusion portion 113 are fitted to recess portion 121. A tip end portion of second member 112 is fitted to first recess portion 123, and protrusion portion 113 is fitted to second recess portion 124. Arc portion 115 of second member 112 is fitted to arc-shaped inner circumferential portion 123a of first recess portion 123, and planar portion 116 of second member 112 is fitted to linear inner circumferential portion 123b of first recess portion 123.

Figure 7:
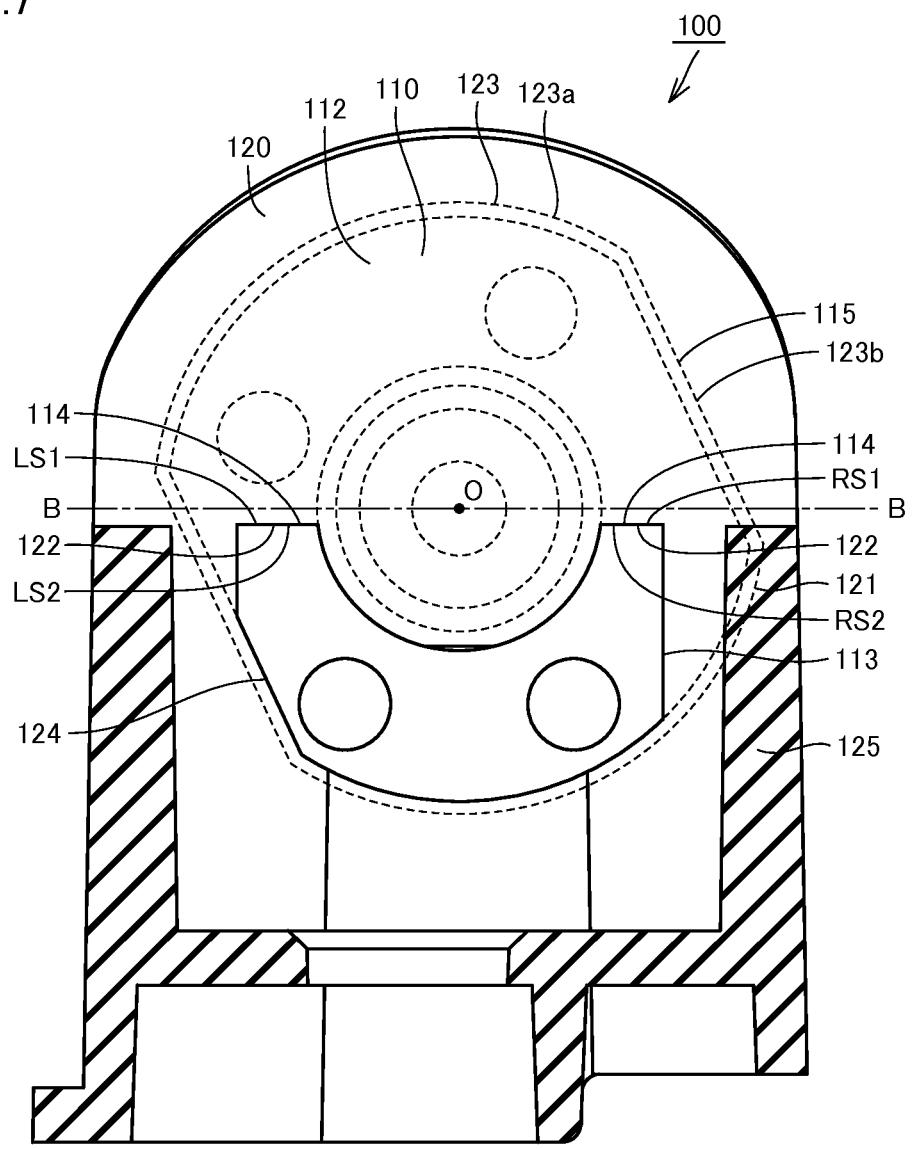
FIG. 7 shows an exemplary illustrative non-limiting cross-sectional view along the line VII-VII in FIG. 5, showing a state that the hinge pin is inserted in the hinge pin reception portion according to an exemplary embodiment.

Referring to FIG. 7, first surface portion 114 of protrusion portion 113 has a right rotation abutment surface RS1 and a left rotation abutment surface LS1. In addition, second surface portion 122 of recess portion 121 has a right rotation abutment surface RS2 and a left rotation abutment surface LS2. Right rotation abutment surface RS1 is a surface which abuts to right rotation abutment surface RS2 when hinge pin 110 rotates to the right (rotation in a direction shown with an arrow R in FIG. 5) around axial direction A. Left rotation abutment surface LS1 is a surface which abuts to left rotation abutment surface LS2 when hinge pin 110 rotates to the left (rotation in a direction shown with an arrow L in FIG. 5) around axial direction A.

Right rotation abutment surface RS1 and left rotation abutment surface LS1 are arranged in radial direction B with a center O of one end surface 112a lying therebetween. Right rotation abutment surface RS1 and left rotation abutment surface LS1 are not continuously formed, and lengths of surfaces abutting to right rotation abutment surface RS2 and left rotation abutment surface LS2 of second surface portion 122 respectively are small. Thus, as compared with a case where right rotation abutment surface RS1 and left rotation abutment surface LS1 are linearly formed, wobbling at the surface abutting to second surface portion 122 can be reduced.

Protrusion portion 113 is constructed such that a portion defining right rotation abutment surface RS1 and a portion defining left rotation abutment surface LS1 are linked to each other. Protrusion portion 113 is integrally formed. Protrusion portion 113 is formed to have a U-shape at one end surface 112a.

Protrusion portion 113 has a shape asymmetric with respect to center O of one end surface 112a. Protrusion portion 113 is formed such that right rotation abutment surface RS1 is smaller than left rotation abutment surface LS1.

Recess portion 121 is provided to expose a part of protrusion portion 113 of hinge pin 110 while hinge pin 110 is inserted in hinge pin reception portion 120. Protrusion portion 113 is formed such that a part of its side surface extends along an outer circumferential surface of second member 112.

Figure 8:
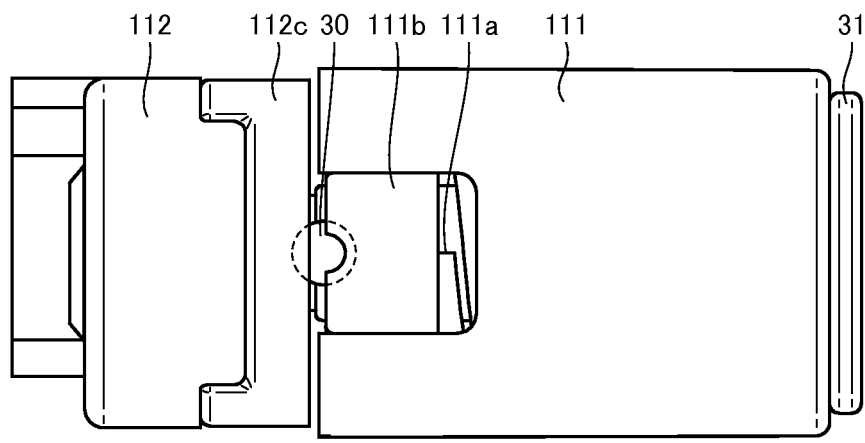
FIG. 8 shows an exemplary illustrative non-limiting schematic front view of the hinge pin according to an exemplary embodiment.
Figure 9:
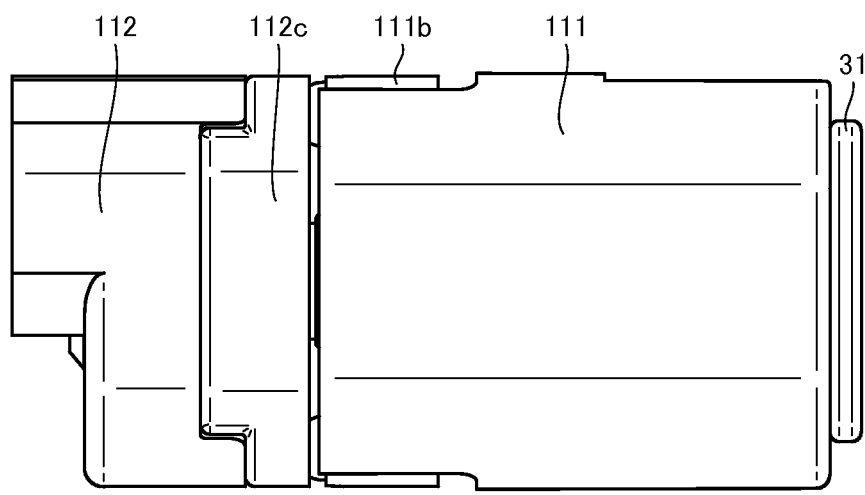
FIG. 9 shows an exemplary illustrative non-limiting schematic top view of the hinge pin according to an exemplary embodiment.

A construction of hinge pin 110 will be described in further detail with reference to FIGS. 8 and 9. It is noted that, for the sake of facilitated illustration, hinge pin 110 is shown in a partially simplified manner in FIGS. 4 to 6 and a spring 111a, a catch 111b, and the like, which will be described next, are simplified. In hinge pin 110, first member 111 has spring 111a and catch 111b. Second member 112 has a disc 112c. While a ball 30 is sandwiched between catch 111b biased by spring 111a and disc 112c, a pin 31 pivotably fixes first member 111 and second member 112.

In disc 112c, three holes each capable of locking ball 30 are formed in a portion opposed to catch 111b. As ball 30 is locked in this hall, an angle of rotation of first member 111 with respect to second member 112 is held. Three holes are formed in conformity with the open state, the closed state, and the full open state of game device 1 shown in FIGS. 1 to 3, respectively. Thus, when hinge pin 110 is assembled in upper housing 20 and lower housing 10 and first member 111 is pivoted with respect to second member 112, upper housing 20 can be locked to lower housing 10 in the open state, the closed state, or the full open state of game device 1.

Figure 10:
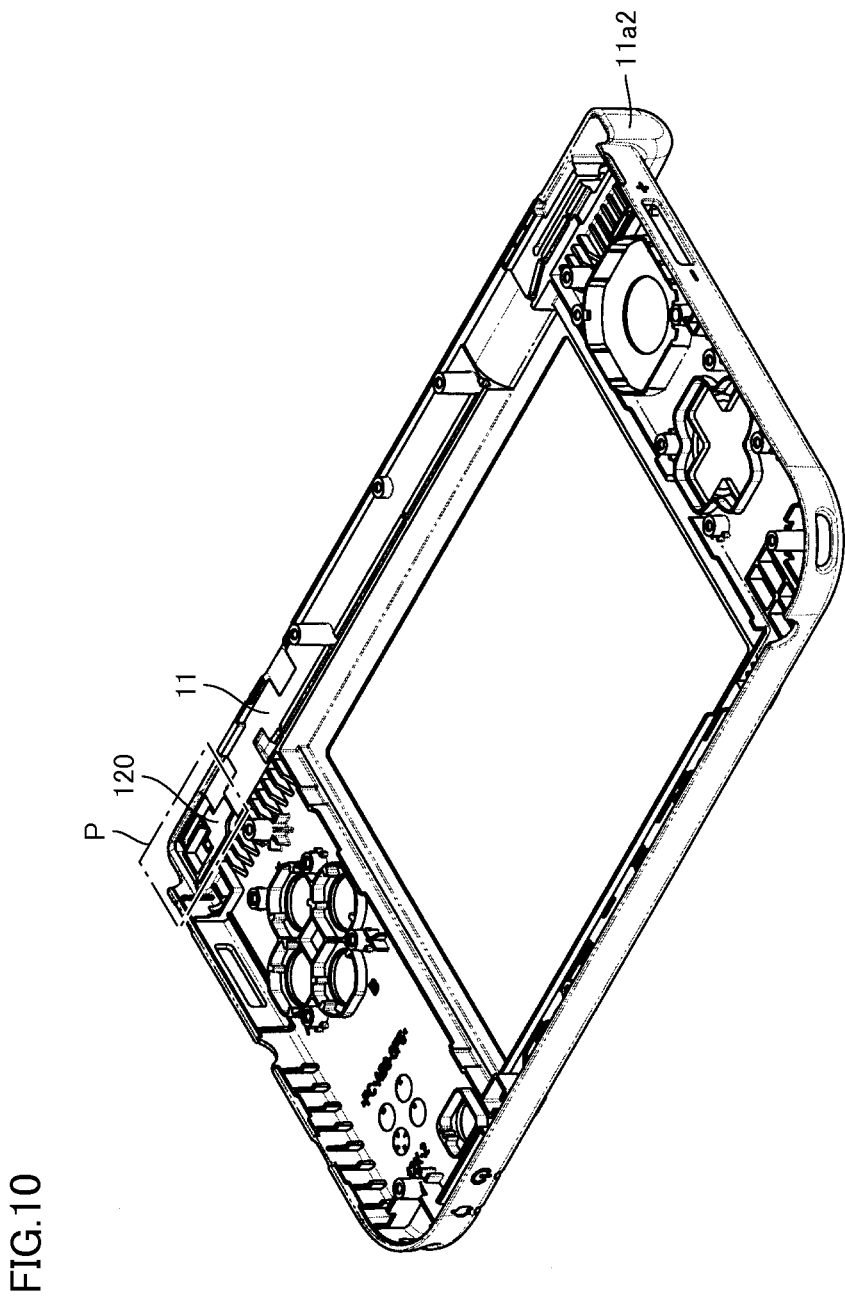
FIG. 10 shows an exemplary illustrative non-limiting schematic perspective view showing a state that the hinge structure is attached to a lower front part according to an exemplary embodiment.
Figure 11:
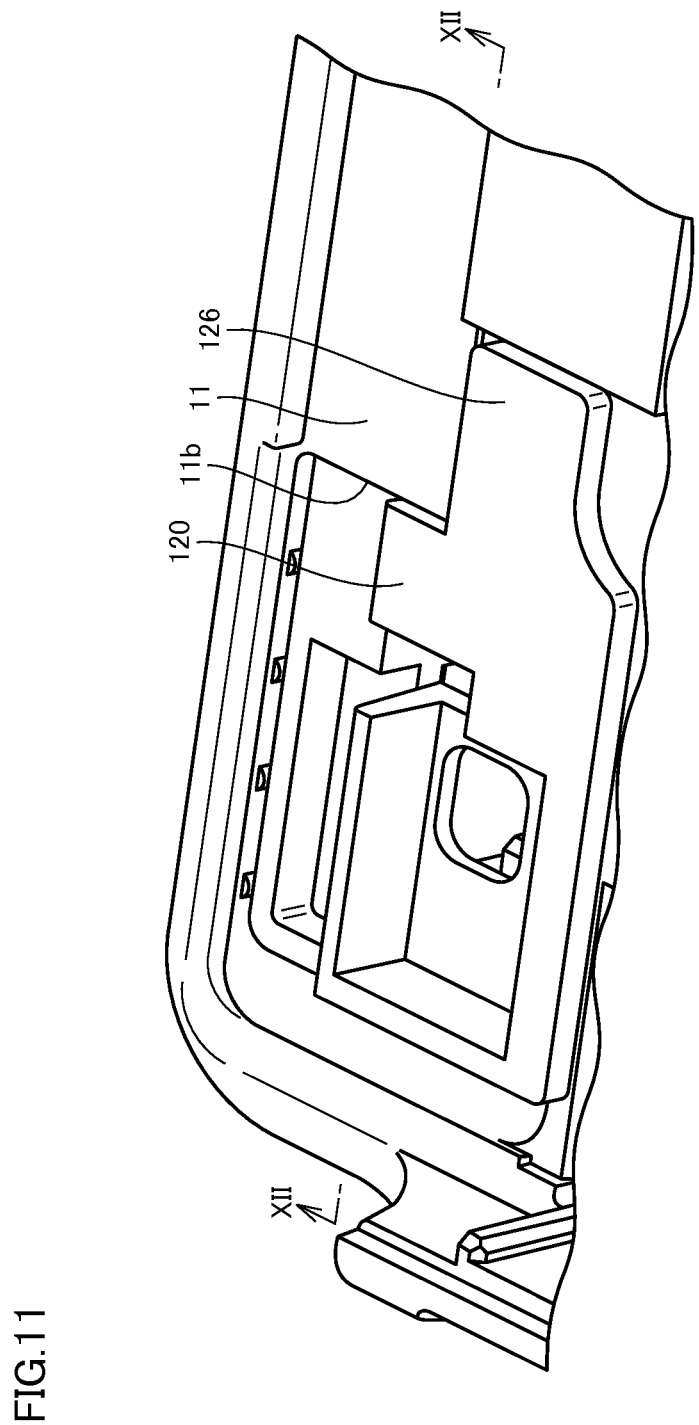
FIG. 11 shows an exemplary illustrative non-limiting enlarged view of a P portion in FIG. 10 according to an exemplary embodiment.

Referring to FIGS. 10 and 11, hinge pin reception portion 120 is inserted in an engagement recess portion 11b of lower front part 11 from a side of projection portion 125 (see FIG. 5). As stopper portion 126 is locked to lower front part 11, a position of hinge pin reception portion 120 is adjusted.

Figure 12:
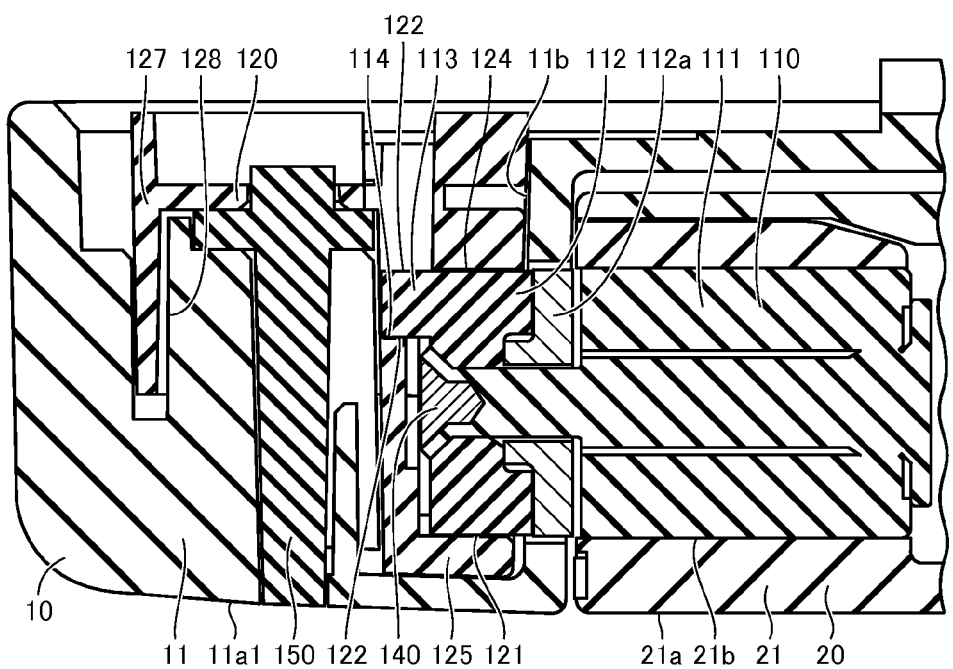
FIG. 12 shows an exemplary illustrative non-limiting schematic cross-sectional view along the line XII-XII in FIG. 11 according to an exemplary embodiment.

Referring to FIG. 12, hinge pin 110 is inserted in and fitted to an engagement hole 21b in upper protrusion portion 21a of upper front part 21 of upper housing 20. Thus, hinge pin 110 is fixed to engagement hole 21b. It is noted that first member 111 and second member 112 of hinge pin 110 are fixed by a stopper 140.

Hinge pin reception portion 120 is inserted in and fitted to engagement recess portion 11b of lower protrusion portion 11a1 of lower front part 11 of lower housing 10. In addition, hinge pin reception portion 120 is fixed to lower protrusion portion 11a1 by an engagement member 150. Thus, hinge pin reception portion 120 is fixed to engagement recess portion 11b.

Since hinge pin 110 is fixed to engagement hole 21b and hinge pin reception portion 120 is fixed to engagement recess portion 11b, lower housing 10 and upper housing 20 can pivot relative to each other by pivoting first member 111 of hinge pin 110 with respect to second member 112.

Figure 13:
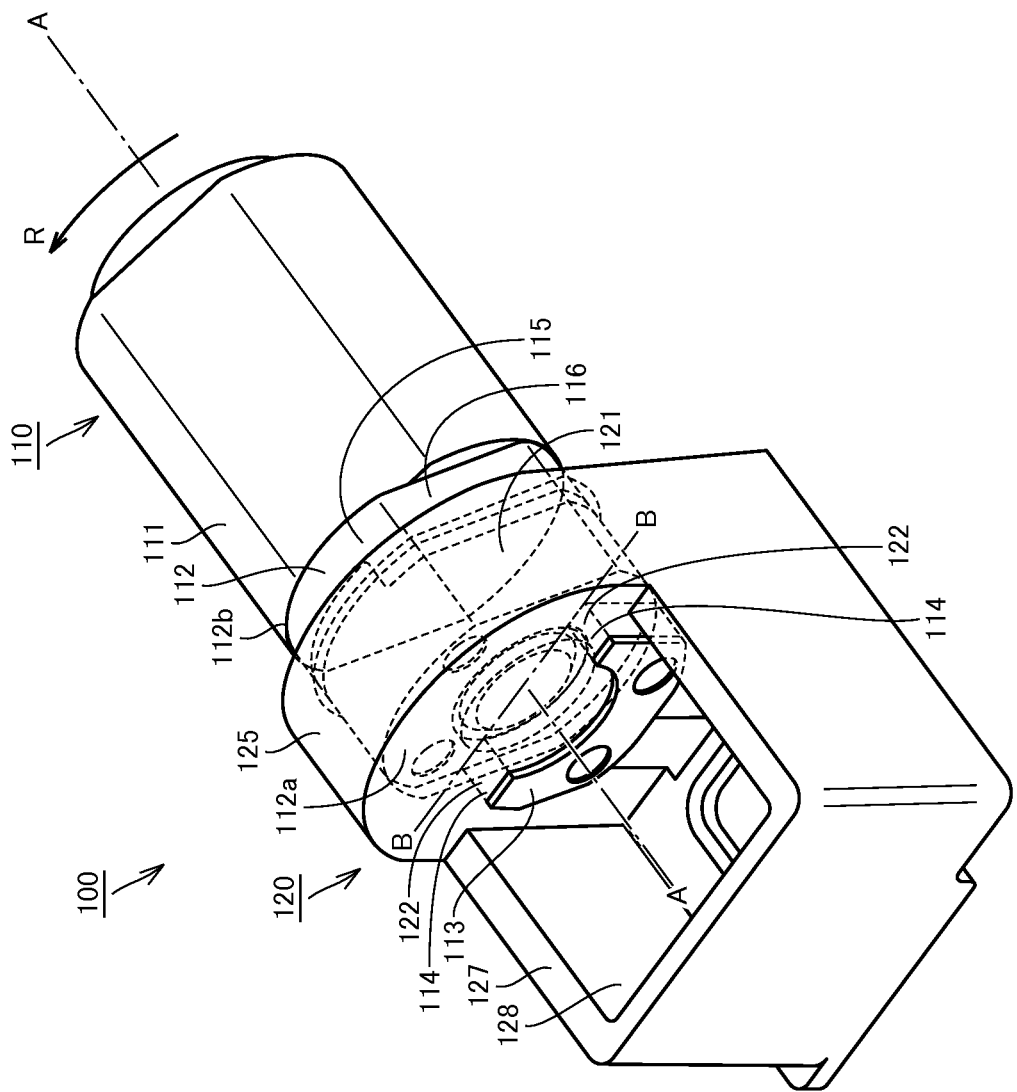
FIG. 13 shows an exemplary illustrative non-limiting schematic perspective view showing a state that a first member is rotated to the right in the hinge structure according to an exemplary embodiment.
Figure 14:
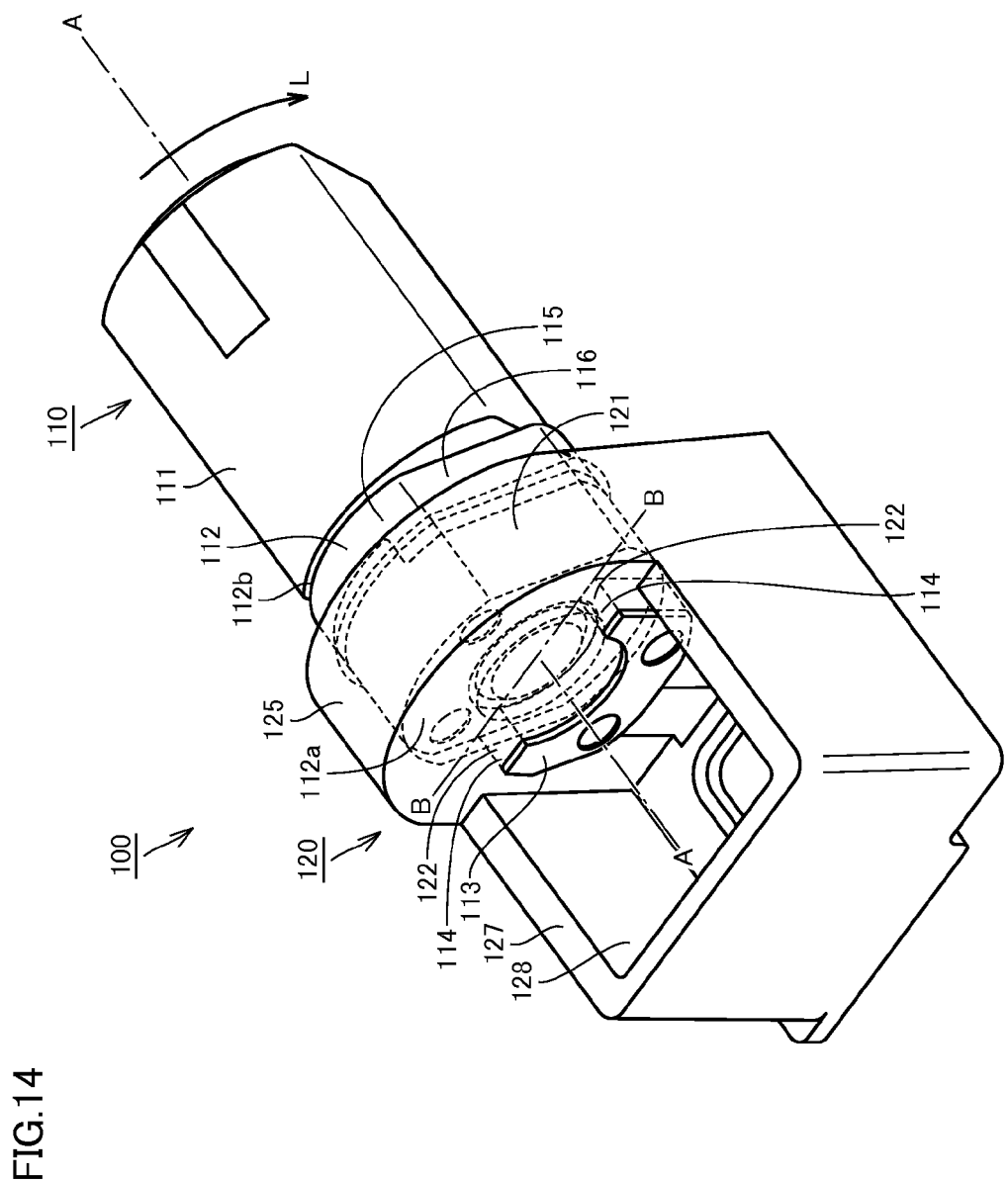
FIG. 14 shows an exemplary illustrative non-limiting schematic perspective view showing a state that the first member is rotated to the left in the hinge structure according to an exemplary embodiment.

An operation of hinge structure 100 and game device 1 including the same will now be described. Referring again to FIG. 5, first member 11 pivots with respect to second member 112 fitted to hinge pin reception portion 120. By rotating first member 111 in the direction shown with arrow R in FIG. 5, hinge structure 100 is in a state shown in FIG. 13. In this case, game device 1 makes transition from the open state to the closed state. Alternatively, by rotating first member 111 in the direction shown with arrow L in FIG. 5, hinge structure 100 is in a state shown in FIG. 14. In this case, game device 1 makes transition from the open state to the full open state.

First surface portion 114 and second surface portion 122 abut to each other, so that they can receive a part of load applied to hinge pin reception portion 120 while second member 112 is pivoted with respect to first member 111. More specifically, when second member 112 is pivoted with respect to first member 111, for example, in making transition to the open state and transition to the full open state, torque is applied to planar portion 116 of second member 112 and consequently load is applied to linear inner circumferential portion 123b of hinge pin reception portion 120 in contact with planar portion 116. In addition thereto, torque is applied also to an abutment surface of first surface portion 114, and second surface portion 122 in contact with the abutment surface also receives load. Thus, load applied to hinge pin reception portion 120 during pivot is distributed. At the surface where first surface portion 114 and second surface portion 122 of the subject application abut to each other, the surface and a direction in which force is applied are perpendicular to each other. Therefore, load can be received without the force being concentrated in a specific portion of the surface.

Figure 15:
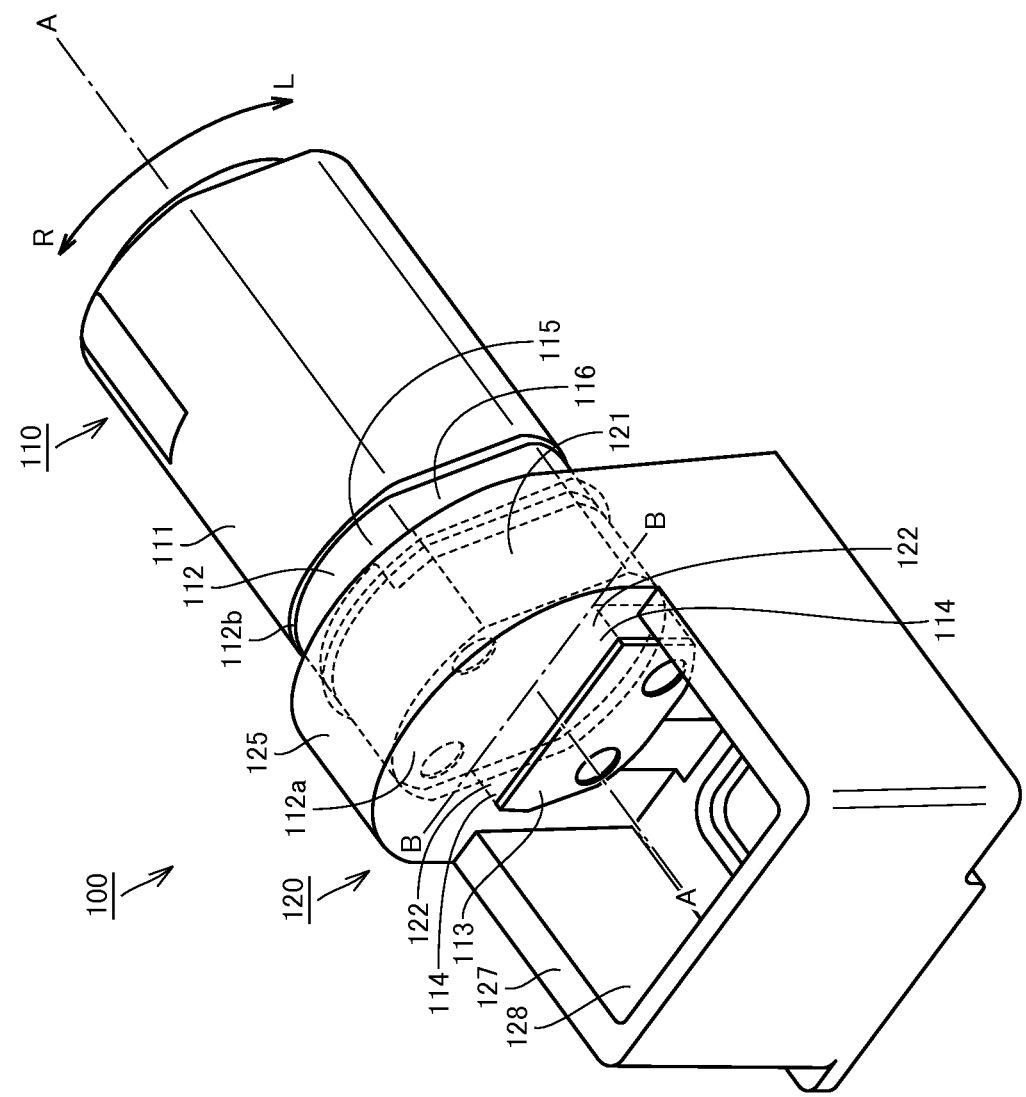
FIG. 15 shows an exemplary illustrative non-limiting schematic perspective view of a hinge structure in a variation according to an exemplary embodiment.

Though a case where protrusion portion 113 is formed to have a U-shape has been described above, a shape of protrusion portion 113 is not limited as such. Referring to FIG. 15, in a hinge structure according to a variation, protrusion portion 113 is formed to have a semicircular shape.

Functions and effects of one or more exemplary embodiments described above will now be described.

In hinge structure 100, a part of second member 112 and protrusion portion 113 fit to recess portion 121. Therefore, in pivoting second member 112 with respect to first member 111, load applied to hinge pin reception portion 120 can be distributed to parts of recess portion 121 fitted to the part of second member 112 and protrusion portion 113. By thus distributing load applied to hinge pin reception portion 120, durability of hinge structure 100 can be improved.

In addition, second surface portion 122 engaged with the first surface portion protruding from one end surface in the axial direction and extending in a radial direction of the second member can receive load during pivot of second member 112 with respect to first member 111. Namely, since a surface of second surface portion 122 can receive load in a direction of pivot, load applied to second surface portion 122 can be distributed. By thus distributing load applied to hinge pin reception portion 120, durability of hinge structure 100 can be improved.

In hinge structure 100, as first surface portion 114 and second surface portion 122 are engaged with each other, pivot of second member 112 with respect to hinge pin reception portion 120 is suppressed and hence second surface portion 122 can receive load. Therefore, since the surface of second surface portion 122 can receive load in a direction of pivot, load applied to second surface portion 122 can be distributed.

In hinge structure 100, right rotation abutment surface RS can distribute load applied to hinge pin reception portion 120 during rotation to the right and left rotation abutment surface LS can distribute load applied to hinge pin reception portion 120 during rotation to the left. Therefore, in any of rotation to the right and rotation to the left, load applied to hinge pin reception portion 120 can be distributed.

In hinge structure 100, protrusion portion 113 can integrally be formed such that the portion defining right rotation abutment surface RS and the portion defining left rotation abutment surface LS are linked to each other. Thus, strength of protrusion portion 113 can be improved.

In hinge structure 100, protrusion portion 113 has a shape asymmetric with respect to the center of one end surface 112a. Therefore, even when load is different depending on a direction of pivot, the protrusion portion can be formed in accordance with load.

In hinge structure 100, since recess portion 121 is provided to expose a part of protrusion portion 113, engagement between protrusion portion 113 and recess portion 121 can visually be checked. Therefore, protrusion portion 113 and recess portion 121 can reliably be fitted to each other.

Game device 1 includes hinge structure 100 described above, upper housing 20 to which hinge pin 110 is attached, and lower housing 10 to which the hinge pin reception portion is attached. Thus, game device 1 including hinge structure 100 capable of achieving improved durability can be provided.

The hinge structure is applicable to various electronic devices in which a plurality of housings are coupled by means of a hinge structure. For example, in addition to the game device above, a mobile phone, a PDA (Personal Digital Assistant), a personal computer, and the like are exemplified as the electronic devices.

While certain example systems, methods, devices, and apparatuses have been described herein, it is to be understood that the appended claims are not to be limited to the systems, methods, devices, and apparatuses disclosed, but on the contrary, are intended to cover various modifications and equivalent arrangements included within the spirit and scope of the appended claims.

What is claimed is:

1. A hinge structure, comprising:
   a hinge pin having a first member and a second member having one end surface and an opposite end surface provided at a distance from each other in an axial direction, having a protrusion portion provided to protrude from said one end surface in said axial direction, arranged to be opposed to said first member at said the opposite end surface, and being pivotable with respect to said first member;
   a hinge pin reception portion having a recess portion into which a part of said second member and said protrusion portion of said hinge pin are inserted,
   said protrusion portion having a first surface portion extending in a radial direction of said second member, said recess portion having a second surface portion engaged with said first surface portion to simultaneously prevent two opposed directions of rotation of the second member with respect to the hinge pin reception portion about the axial direction, and said recess portion exposing a part of said protrusion portion opposite to said one end surface in the axial direction, wherein said first surface portion includes a right rotation abutment surface abutting to said second surface portion when said hinge pin rotates to right around said axial direction and a left rotation abutment surface abutting to said second surface portion when said hinge pin rotates to left around said axial direction, and the right rotation abutment surface and the left rotation abutment surface are parallel to a radial direction with a center of the one end surface lying between the right rotation abutment surface and the left rotation abutment surface, and the right rotation abutment surface and the left rotation abutment surface are not continuous with another.

2. The hinge structure according to claim 1, wherein said protrusion portion is constructed such that a portion defining said right rotation abutment surface and a portion defining said left rotation abutment surface are linked to each other.

3. The hinge structure according to claim 1, wherein said protrusion portion has a shape asymmetric with respect to a center of said one end surface.

4. An electronic device, comprising:
a hinge structure including
  a hinge pin having a first member and a second member having one end surface and an opposite end surface provided at a distance from each other in an axial direction, having a protrusion portion provided to protrude from said one end surface in said axial direction, arranged to be opposed to said first member at said the opposite end surface, and being pivotable with respect to said first member, and
  a hinge pin reception portion having a recess portion into which to a part of said second member and said protrusion portion of said hinge pin are inserted, said protrusion portion having a first surface portion extending in a radial direction of said second member, said recess portion having a second surface portion engaged with said first surface portion to simultaneously prevent two opposed directions of rotation of the second member with respect to the hinge pin reception portion about the axial direction and said recess portion exposing a part of said protrusion portion opposite to said one end surface in the axial direction, wherein
  said first surface portion includes a right rotation abutment surface abutting to said second surface portion when said hinge pin rotates to right around said axial direction and a left rotation abutment surface abutting to said second surface portion when said hinge pin rotates to left around said axial direction, and
  the right rotation abutment surface and the left rotation abutment surface are parallel to a radial direction with a center of the one end surface lying between the right rotation abutment surface and the left rotation abutment surface, and the right rotation abutment surface and the left rotation abutment surface are not continuous with one another;
a first housing to which said hinge pin is attached; and
a second housing to which said hinge pin reception portion is attached.

5. The electronic device according to claim 4, wherein said protrusion portion is constructed such that a portion defining said right rotation abutment surface and a portion defining said left rotation abutment surface are linked to each other.

6. The electronic device according to claim 4, wherein said protrusion portion has a shape asymmetric with respect to a center of said one end surface.

* * * * *